United States Patent
Okita et al.

(10) Patent No.: US 12,419,069 B2
(45) Date of Patent: Sep. 16, 2025

(54) NITRIDE SEMICONDUCTOR DEVICE WITH SUPPRESSED LEAKAGE CURRENT AND METHOD OF FABRICATING THE SAME

(71) Applicant: Panasonic Intellectual Property Management Co., Ltd., Osaka (JP)

(72) Inventors: Hideyuki Okita, Toyama (JP); Masahiro Hikita, Hyogo (JP); Manabu Yanagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 735 days.

(21) Appl. No.: 17/626,055

(22) PCT Filed: Jun. 24, 2020

(86) PCT No.: PCT/JP2020/024734
§ 371 (c)(1),
(2) Date: Jan. 10, 2022

(87) PCT Pub. No.: WO2021/019969
PCT Pub. Date: Feb. 4, 2021

(65) Prior Publication Data
US 2022/0254902 A1     Aug. 11, 2022

(30) Foreign Application Priority Data
Jul. 31, 2019 (JP) .................. 2019-141234

(51) Int. Cl.
*H10D 30/01* (2025.01)
*H10D 30/47* (2025.01)
*H10D 62/85* (2025.01)

(52) U.S. Cl.
CPC .......... *H10D 30/015* (2025.01); *H10D 30/47* (2025.01); *H10D 62/8503* (2025.01)

(58) Field of Classification Search
CPC .......... H01L 29/66431; H01L 29/2003; H01L 29/778; H01L 29/7786
See application file for complete search history.

(56) References Cited

U.S. PATENT DOCUMENTS

2013/0277680 A1* 10/2013 Green ................ H01L 29/2003
257/E21.409
2013/0292690 A1  11/2013 Ando et al.
(Continued)

FOREIGN PATENT DOCUMENTS

JP     2004-95640 A    3/2004
JP     2013-235873 A  11/2013
(Continued)

OTHER PUBLICATIONS

International Search Report issued in corresponding International Patent Application No. PCT/JP2020/024734, dated Sep. 15, 2020, with English translation.

*Primary Examiner* — Lex H Malsawma
*Assistant Examiner* — Bruce R. Smith
(74) *Attorney, Agent, or Firm* — Rimon P.C.

(57) ABSTRACT

A nitride semiconductor device includes a semiconductor layered structure including a substrate, a channel layer, and a barrier layer. The channel layer is formed above the substrate and made of a nitride semiconductor layer. The barrier layer is formed on the channel layer, has a wider band gap than the channel layer, and is made of a nitride semiconductor layer. The semiconductor layered structure includes an isolation region in which impurities are implanted. The position of an impurity concentration peak in the depth direction in the isolation region is deeper than the interface between the barrier layer and the channel layer. The concentration of the impurities at the interface between the barrier layer and the channel layer in the isolation region (Continued)

is lower than the concentration at the impurity concentration peak.

12 Claims, 11 Drawing Sheets

(56) References Cited

U.S. PATENT DOCUMENTS

| | | | |
|---|---|---|---|
| 2014/0252490 A1* | 9/2014 | Usujima | H01L 29/66462 438/296 |
| 2017/0170283 A1* | 6/2017 | Laboutin | H01L 21/02458 |
| 2019/0207018 A1* | 7/2019 | Makiyama | H01L 29/7786 |

FOREIGN PATENT DOCUMENTS

| | | |
|---|---|---|
| JP | 2014-99523 A | 5/2014 |
| WO | 2018/180021 A1 | 10/2018 |

\* cited by examiner

Ratio of impurity concentration at interface between barrier layer and channel layer to impurity concentration at interface between channel layer and high-carbon layer

NITRIDE SEMICONDUCTOR DEVICE WITH SUPPRESSED LEAKAGE CURRENT AND METHOD OF FABRICATING THE SAME

CROSS-REFERENCE OF RELATED APPLICATIONS

This application is the U.S. National Phase under 35 U.S.C. § 371 of International Patent Application No. PCT/JP2020/024734, filed on Jun. 24, 2020, which in turn claims the benefit of Japanese Application No. 2019-141234, filed on Jul. 31, 2019, the entire disclosures of which Applications are incorporated by reference herein.

TECHNICAL FIELD

The present invention relates to a nitride semiconductor device and the method of fabricating the same and, in particular, to a nitride semiconductor device usable as, for example, a field-effect transistor and the method of fabricating the same.

BACKGROUND ART

Because of their wide band gaps, group III-nitride semiconductors have high breakdown voltages. In addition, a heterostructure, such as AlGaN/GaN, can be easily formed. The band gap difference between AlGaN and GaN and piezo-charges generated by the lattice constant difference between AlGaN and GaN enable the generation of a high-mobility, high-concentration electron channel (two-dimensional electron gas) on the GaN layer side of an AlGaN/GaN interface. By controlling the two-dimensional electron gas, it is possible to fabricate a high-electron-mobility transistor (HEMT). Because of such high-resistance, high-speed, and high-current characteristics, group III-nitride semiconductors are used in electronic devices, such as field-effect transistors (FETs) and diodes for power applications.

The semiconductor device illustrated in FIGS. 1 to 4 disclosed in Patent Literature 1 (PTL 1) has a semiconductor layered structure in which an i-GaN buffer layer, an InGaN back barrier layer, an i-GaN electron transit layer (channel layer), an AlN intermediate layer, an InAlGaN electron supply layer (barrier layer), and a GaN cap layer are sequentially epitaxially grown above a SiC substrate. In the semiconductor layered structure, a two-dimensional-electron-gas layer is generated in a portion of the electron transit layer near the intermediate layer because of a band gap difference between the electron transit layer and the two layers of the electron supply layer and the intermediate layer and piezo-charges in the electron supply layer and the intermediate layer. A source electrode and a drain electrode that are in ohmic contact with a second group III-nitride semiconductor layer are apart from each other above the electron supply layer. A gate electrode is present between and apart from the source electrode and the drain electrode. The above semiconductor device is an FET capable of controlling a drain current flowing between the source electrode and the drain electrode via the two-dimensional-electron-gas layer by a voltage applied to the gate electrode. In the inactive region of the FET (region other than the active region of the FET), an isolation structure (see (b) in FIG. 1 disclosed in PTL 1) extending from the top surface of the semiconductor layered structure and reaching the substrate is formed by implanting, for example, Ar. In addition, the InGaN back barrier layer contains carbon (hereinafter, simply referred to as C) and has a high-C-concentration portion.

According to PTL 1, since the back barrier layer contains C, C acts as an acceptor level, which results in higher conduction band potential and suppresses electrons from diffusing toward the buffer layer. At the same time, it is possible to suppress a short channel effect and decrease a drain leakage current.

CITATION LIST

Patent Literature

[PTL 1] WO2018/180021

SUMMARY OF INVENTION

Technical Problem

However, the semiconductor device disclosed in PTL 1 has the following issues.

In the structure illustrated in FIGS. 1 to 4 disclosed in PTL 1, the back barrier layer (InGaN having a film thickness of 5 nm or less) is very thin. Thus, during high-voltage, high-temperature operation like power semiconductor operation, a drain leakage current (the sum of a leakage current between the drain and the gate, a leakage current between the drain and the source, and a leakage current between the drain and the substrate) and a source leakage current (a leakage current between the drain and the source) flow toward the buffer layer, which decreases the reliability. In addition, according to PTL 1, the isolation structure is formed by implanting impurities (Ar). However, depending on the impurity implantation dose and depth distribution, a leakage current that will flow from the drain electrode into the isolation structure is generated especially during high-voltage, high-temperature operation like power semiconductor operation, which decreases the reliability.

In view of the foregoing, the present invention aims to provide a nitride semiconductor device in which a leakage current is suppressed and the method of fabricating the same.

Solution to Problem

To achieve the aim, a nitride semiconductor device according to an embodiment of the present invention includes a semiconductor layered structure that includes: a substrate; a channel layer disposed above the substrate and including a nitride semiconductor layer; and a barrier layer disposed on the channel layer, having a band gap wider than the band gap of the channel layer, and including a nitride semiconductor layer. The semiconductor layered structure includes an isolation region in which impurities are implanted. The position of an impurity concentration peak in the depth direction from the top surface of the semiconductor layered structure is deeper than the interface between the barrier layer and the channel layer, the impurity concentration peak being one of at least one concentration peak of the impurities in the isolation region in the depth direction. The concentration of the impurities at the interface is lower than the concentration at the impurity concentration peak.

To achieve the aim, a method of fabricating a nitride semiconductor device according to another embodiment of the present invention includes: forming a semiconductor layered structure by preparing a substrate, forming, above the substrate, a channel layer including a nitride semiconductor layer, and forming, above the channel layer, a barrier layer having a band gap wider than the band gap of the channel layer and including a nitride semiconductor layer; and forming an isolation region by implanting impurities from above the semiconductor layered structure. The forming of the isolation region includes: implanting the impurities to cause the position of an impurity concentration peak in the depth direction to be deeper than the interface between the barrier layer and the channel layer, the impurity concentration peak being one of at least one concentration peak of the impurities in the isolation region in the depth direction; and implanting the impurities to cause the concentration of the impurities at the interface to be lower than the concentration at the impurity concentration peak.

Advantageous Effects of Invention

The nitride semiconductor device and the method of fabricating the same according to the present invention enable suppression of a leakage current.

DESCRIPTION OF EMBODIMENT

Hereinafter, a nitride semiconductor device according to the embodiment is described in detail with reference to the drawings. It should be noted that the embodiment described below is a specific example of the present invention. For example, the numerical values, shapes, materials, structural elements, and arrangement and connections of the structural elements described in the embodiment below are examples and not intended to limit the present invention. In addition, among the structural elements described in the embodiment below, the structural elements not included in the independent claims, which represent superordinate concepts, are described as optional structural elements. In addition, regarding the expression on an object, unless a limitation such as the state of being in contact is provided, the expression encompasses not only a state of being in contact with the object at a higher or lower position, but also a state of being at a position above or below the object and not being in contact with the object. The expressions on, above, and, below an object are used to describe relative positional relationships in an illustrated state and are not intended to describe absolute positional relationships in the direction of gravity.

Figure 1:
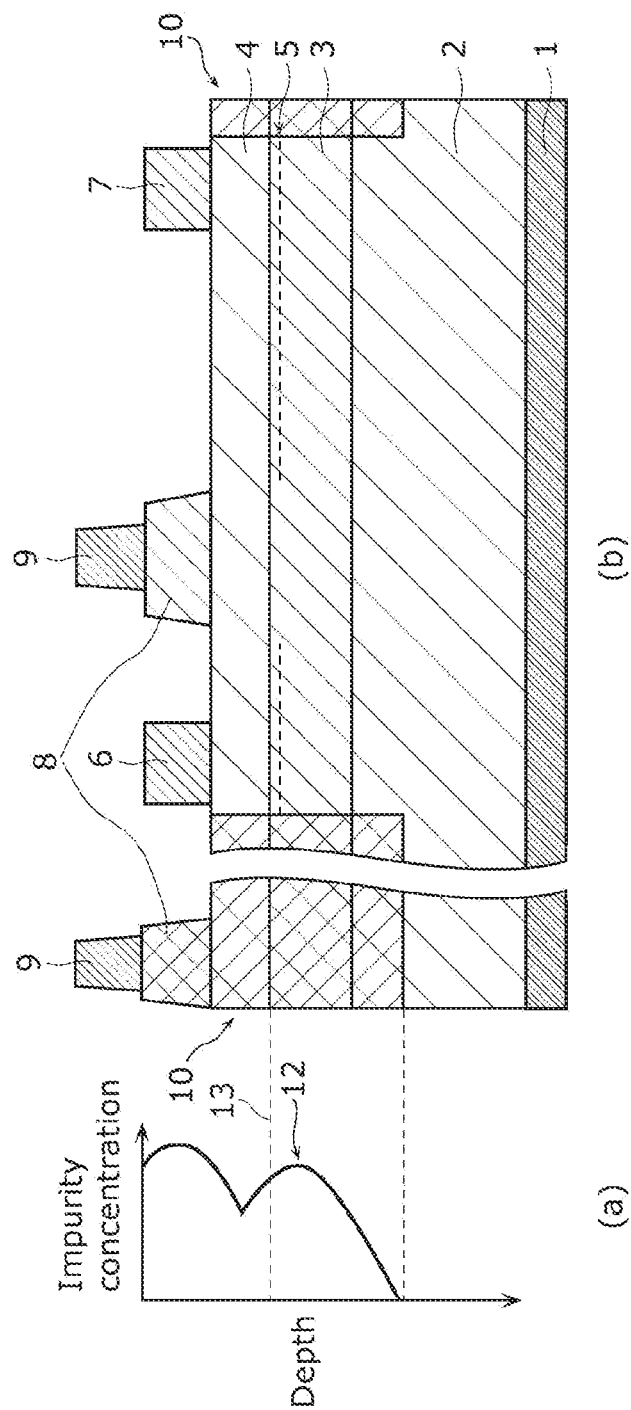
FIG. 1 illustrates a cross-sectional structure of a nitride semiconductor device according to an embodiment and a relationship between impurity concentration and depth in an isolation region.

FIG. 1 illustrates a cross-sectional structure of a nitride semiconductor device according to an embodiment ((b) in FIG. 1) and a relationship between impurity concentration and depth in an isolation region ((a) in FIG. 1). As illustrated in (b) in FIG. 1, the nitride semiconductor device includes a semiconductor layered structure including substrate 1, channel layer 3, and barrier layer 4. Channel layer 3 is formed above substrate 1 and made of a nitride semiconductor layer. Barrier layer 4 is formed on channel layer 3, has a wider band gap than channel layer 3, and is made of a nitride semiconductor layer. In the embodiment, more specifically, the semiconductor layered structure includes, in order from bottom to top, substrate 1, buffer layer 2, channel layer 3, two-dimensional-electron-gas layer 5, barrier layer 4, and gate layer 8. Source electrode 6 and drain electrode 7 are formed on barrier layer 4. The semiconductor layered structure includes impurity implanted isolation region 10 (a hatched portion having lines sloping upward to the left). As illustrated in (a) in FIG. 1, the position of impurity concentration peak 12 in the depth direction from the top surface of the semiconductor layered structure is deeper than interface 13 between barrier layer 4 and channel layer 3, impurity concentration peak 12 being a depth direction concentration peak of the impurities in isolation region 10. The impurity concentration at interface 13 is lower than the concentration at impurity concentration peak 12.

That is, in impurity implanted isolation region 10 in the semiconductor layered structure, the position of impurity concentration peak 12 in the depth direction in isolation region 10 is deeper (closer to the bottom in FIG. 1) than interface 13 between channel layer 3 and barrier layer 4 when viewed from the top surface of the semiconductor layered structure. The impurity concentration at interface 13 between barrier layer 4 and channel layer 3 in isolation region 10 is lower than the concentration at impurity concentration peak 12 in the depth direction.

More specifically, the semiconductor layered structure includes suitable substrate 1, suitable buffer layer 2, channel layer 3, and barrier layer 4. Substrate 1 is made of, for example, Si (alternatively, for example, Sapphire, SiC, GaN, or AlN). Buffer layer 2 (a single layer or layers made of one or more of, for example, GaN, AlGaN, AlN, InGaN, InN, and AlInGaN, which are group III-nitride semiconductors) is formed above substrate 1. Channel layer 3 is formed above buffer layer 2 and made of GaN (alternatively, for example, InGaN, InN, AlGaN, or AlInGaN, which is a group III-nitride semiconductor). Barrier layer 4 is formed above channel layer 3 and made of AlGaN (alternatively, for example, GaN, InGaN, AlGaN, AlN, or AlInGaN, which is a group III-nitride semiconductor). Barrier layer 4 has a wider band gap than channel layer 3. Under the conditions that barrier layer 4 is AlGaN and that channel layer 3 is GaN, high-concentration two-dimensional-electron-gas layer 5 is generated in a portion of channel layer 3 near interface 13 between barrier layer 4 and channel layer 3 because of the band gap difference between AlGaN and GaN and piezo-charges generated by the lattice constant difference between AlGaN and GaN.

When various group III-nitride semiconductor layers, such as barrier layer 4 and channel layer 3, are grown epitaxially, for example, by the metal-organic chemical vapor deposition (MOCVD), carbon (C) contained in an organometallic material, such as trimethylgallium (TMG), is incorporated into group III-nitride semiconductor crystals. Carbon (C) in a group III-nitride semiconductor layer acts as an acceptor level in the crystal, which leads to higher conduction band potential and the high resistance of a group III-nitride semiconductor. However, for the sake of an efficient electron flow, it is preferable that channel layer 3 have fewer extra energy levels and a lower C concentration. Specifically, it is preferable that C concentrations within channel layer 3 be lower than $1E+18$ cm$^{-3}$, if possible, lower than or equal to $5E+17$ cm$^{-3}$. It should be noted that nE+m denotes $n\times10^m$, In addition, channel layer 3 does not have to be a single layer and may have a layered structure, such as a double heterostructure in which a low-C-concentration GaN layer is combined with a low-C-concentration, low-Al-composition AlGaN layer formed below the GaN layer. This enables carriers to be confined in a top portion of channel layer 3, which improves pinch-off characteristics.

Source electrode 6 and drain electrode 7 formed above barrier layer 4 are apart from each other. Source electrode 6 and drain electrode 7 are each made of one or more of metals, such as Ti, Al, Mo, and Hf capable of making ohmic contact with one of two-dimensional-electron-gas layer 5, barrier layer 4, and channel layer 3. Source electrode 6 and drain electrode 7 should be electrically connected to two-dimensional-electron-gas layer 5. Source electrode 6 and drain electrode 7 may be formed, for example, on the top surface of barrier layer 4. Although not illustrated, source electrode 6 and drain electrode 7 may be brought into contact with one of two-dimensional-electron-gas layer 5, barrier layer 4, and channel layer 3 by a known ohmic recess technique.

The semiconductor layered structure includes gate layer 8 selectively formed above barrier layer 4, gate layer 8 being between and apart from source electrode 6 and drain electrode 7. Gate layer 8 is made of P—GaN containing p-type impurities (such as Mg, Zn, or C) (alternatively, for example, p-InGaN, p-InN, p-AlGaN, or p-AlInGaN, which is a group III-nitride semiconductor). Gate layer 8 may be P—GaN containing Mg, insulating-GaN (i-GaN) containing, for example, C (alternatively, for example, i-InGaN, i-InN, i-AlGaN, or i-AlInGaN, which is a group III-nitride semiconductor), or n-GaN containing n-type impurities, such as Si (alternatively, for example, n-InGaN, n-AlGaN, n-InN, or n-AlInGaN, which is a group III-nitride semiconductor). In addition, as illustrated in FIG. 1, gate layer 8 may be at a position other than between source electrode 6 and drain electrode 7. Gate electrode 9 is formed on a portion of the top surface of gate layer 8, which is formed in a portion apart from source electrode 6 and drain electrode 7 above barrier layer 4. As illustrated in FIG. 1, gate electrode 9 may be formed above gate layer 8, and if gate layer 8 is not present, a metal-semiconductor (MES) structure (not illustrated) may be employed in which gate electrode 9 is in direct contact with barrier layer 4. For the MES structure, gate electrode 9 makes Schottky contact with barrier layer 4. In addition, although not illustrated, a metal-insulator-semiconductor (MIS) structure or a metal-oxide-semiconductor (MOS) structure may be employed. In the MIS and MOS structures, an insulating film, such as SiNx, SiOx, or AlOx, is interposed instead of gate layer 8 below gate electrode 9.

From the safety perspective, it is preferable that a power semiconductor perform a normally-off operation. If gate layer 8 is a p-type group III-nitride semiconductor, a p-n junction is formed directly below gate layer 8, and in a state in which a gate voltage is not applied to gate electrode 9, two-dimensional-electron-gas layer 5 is depleted, which leads to a normally-off state. At that time, the film thickness of barrier layer 4 changes depending on the setting threshold voltage (Vth). However, if barrier layer 4 is AlGaN, under the condition that the Al composition of AlGaN of barrier layer 4 accounts for 20% in a part of a portion directly below gate layer 8, AlGaN has a film thickness of 10 nm to 25 nm, preferably, a film thickness of around 20 nm. In addition, if gate layer 8 is p-GaN, gate layer 8 should have a film thickness of 50 nm to 500 nm, preferably, a film thickness of around 100 nm. If the p-type impurities are Mg, the doping concentration of Mg should range from $1E+19$ cm$^{-3}$ to $10E+19$ cm$^{-3}$ and preferably be a doping concentration of $5E+19$ cm$^{-3}$. It should be noted that the carrier density of p-GaN doped with Mg at a doping concentration of around $5E+19$ cm$^{-3}$ ranges from substantially around $1E+17$ cm$^{-3}$ to $5E+17$ cm$^{-3}$. This is because the activation rate of Mg is several percent or less, which is extremely low.

Gate electrode 9 should be made of one or more of metals, such as Ti, Ni, Pd, Pt, Au, W, WSi, Ta, TiN, Al, Mo, Hf, and Zr. If gate layer 8 is a p-type semiconductor, gate electrode 9 may make ohmic or Schottky contact with gate layer 8. However, ohmic contact enables higher reliability of gate electrode 9. Thus, it is preferable that gate electrode 9 be made of one or more of metals having low contact resistance, such as Ni, Pt, Pd, Au, Ti, Cr, In, Sn, and Al.

The semiconductor layered structure includes isolation region 10 whose high resistance has been achieved by implanting impurities into a portion of the group III-nitride semiconductor layers including barrier layer 4 at the top and buffer layer 2 at the bottom to cause crystal defects and inactivation. When viewed from above, isolation region 10 surrounds the active region (FET region) of the group III-nitride semiconductor device (see FIG. 11). An element that enables the group III-nitride semiconductor layers to have high resistance is used as an impurity to be implanted into isolation region 10. Specifically, it is preferable that the element be at least one of, for example, H, He, B, C, N, O, F, Mg, Cl, Ar, Ca, Ti, Cr, Fe, Cu, Zn, As, and Ru. If impurities in isolation region 10 are implanted by ion implantation, an impurity concentration distribution in the depth direction is not even and has impurity concentration peak 12 in the depth direction. The impurity concentration distribution represents an approximate depth direction normal distribution centered around impurity concentration peak 12. Impurity concentration peak 12 in the depth direction does not have to be one peak, and there may be two or more impurity concentration peaks. To achieve high resistance and inactivation evenly from the top side, such as barrier layer 4, to a deep portion, such as buffer layer 2, it is in fact preferable that the impurity concentration distribution have two or more impurity concentration peaks 12 in the depth direction. For instance, when there are two impurity concentration peaks 12 in the depth direction, the impurity concentration distribution in the depth direction represents a distribution as illustrated in (a) in FIG. 1. The impurity concentration distribution represents approximate depth direction normal distributions centered around the respective peaks, and an overlapping portion of the normal distributions represents the sum of impurity concentrations. It should be noted that in the relationship diagram of impurity concentration and depth illustrated in (a) in FIG. 1, the impurity concentration axis is log-scaled. When the depth where the impurity concentration is 1E+17 cm$^{-3}$ or higher is defined as the depth of isolation region 10, in order to form isolation region 10 extending from the top surface of gate layer 8 and reaching buffer layer 2, the depth of isolation region 10 is at least 500 nm or greater, preferably, 800 nm or greater.

Figure 11:
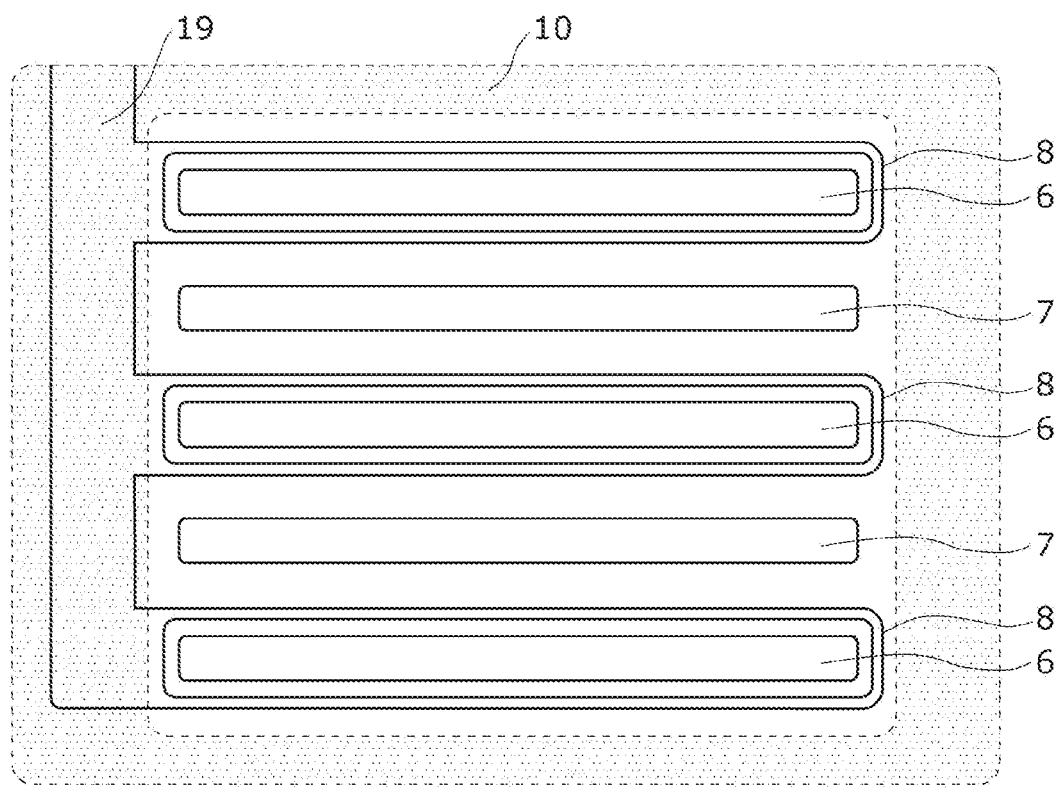
FIG. 11 is a plan view illustrating a plan view structure of the nitride semiconductor devices according to the embodiment and the variations thereof.

It should be noted that as illustrated in FIG. 1, when isolation region 10 is formed also in gate layer 8, in order to decrease capacitance between the gate and the source (substrate) and a gate leakage current, it is preferable that impurities be implanted also into gate layer 8 to cause crystal defects and inactivation and make gate layer 8 have high resistance. High-speed operation of the device is made possible by decreasing the capacitance between the gate and the source (substrate). In addition, regarding impurity implantation when gate layer 8 is present, it is possible to save costs by implanting impurities from above gate layer 8 into buffer layer 2 all at once (that is, by performing one-time implantation). Since one-time implantation is performed, a depth in which impurities are implanted in isolation region 10 is the same both in the portion directly below gate layer 8 and in other portions not directly below gate layer 8 (FIG. 1). Here, the same depth means depths within a range of depth variations of implanted impurities in different portions when impurities are implanted through one process. Specifically, one depth is plus or minus 20% or less than the other, preferably, plus or minus 10% or less, more preferably, plus or minus 5% or less. It should be noted that although gate layer 8 in isolation region 10 appears in the cross section illustrated in FIG. 1, gate layer 8 in isolation region 10 does not have to appear in the same cross section. As illustrated in FIG. 11, gate layer 8 in isolation region 10 may be disposed so as to have an angle of 90 degrees or other angles relative to gate layer 8 in isolation region 10 illustrated in FIG. 1.

Regarding impurity concentrations within channel layer 3 in isolation region 10, it is necessary to suppress the impurity implantation dose to some extent and reduce crystal defects. If excessive crystal defects are present in channel layer 3, a leakage path running through the crystal defects within channel layer 3 is formed during high-voltage operation and during high-temperature operation, and a leakage current flowing through the leakage path increases as time elapses, which results in poor reliability. Thus, in isolation region 10, it is necessary to suppress the impurity implantation dose in channel layer 3, especially in a portion of channel layer 3 (a top portion of channel layer 3) in which two-dimensional-electron-gas layer 5 is formed and that is near interface 13 between barrier layer 4 and channel layer 3. An excessively low impurity implantation dose in buffer layer 2, however, increases a drain leakage current (the sum of a leakage current between the drain and the gate, a leakage current between the drain and the source, and a leakage current between the drain and the substrate) and a source leakage current (a leakage current between the drain and the source) flowing via buffer layer 2 or a portion of isolation region 10 corresponding to a bottom portion of channel layer 3. Such contradictory issues are addressed by meeting the following conditions: the position of impurity concentration peak 12 in the depth direction is deeper than interface 13 between barrier layer 4 and channel layer 3; the impurity concentration at interface 13 between barrier layer 4 and channel layer 3 in isolation region 10 is lower than the concentration at impurity concentration peak 12 in the depth direction; and a certain level of an impurity concentration in buffer layer 2 is ensured.

Figure 2:
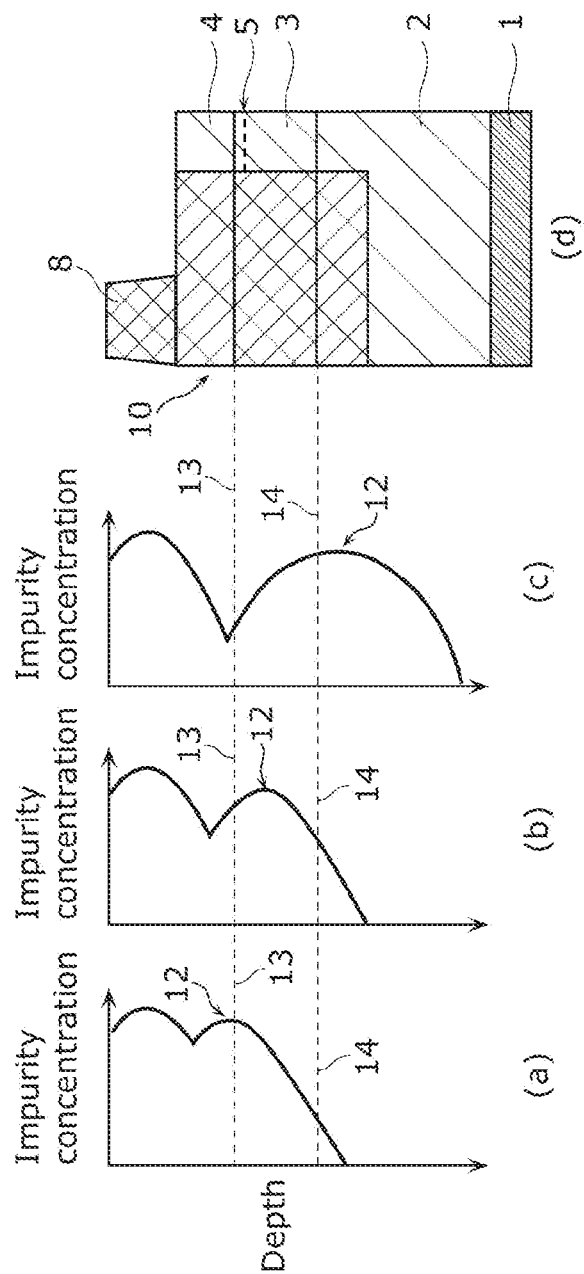
FIG. 2 illustrates detailed relationships between impurity concentration and depth in the isolation region in the nitride semiconductor device according to the embodiment.

FIG. 2 illustrates detailed relationships between impurity concentration and depth in the isolation region of the nitride semiconductor device according to the embodiment. Impurity concentration peak 12 in the depth direction may be in channel layer 3 as illustrated in (b) in FIG. 2 or in buffer layer 2 below channel layer 3 as illustrated in (c) in FIG. 2. However, it is not preferable that impurity concentration peak 12 in the depth direction be above interface 13 between barrier layer 4 and channel layer 3 as illustrated in (a) in FIG. 2. In a distribution as illustrated in (a) in FIG. 2, the impurity implantation dose in buffer layer 2 is excessively low, which increases a drain leakage current and a source leakage current flowing via buffer layer 2.

Hereinafter, operation of the nitride semiconductor device is described. Under the condition that the nitride semiconductor device includes gate layer 8 made of p-GaN and is an FET that performs a normally-off operation, in a state in which zero volts are applied to gate electrode 9, a p-n junction depletion layer is spread directly below gate layer 8, that is, two-dimensional-electron-gas layer 5 is not present. Thus, the nitride semiconductor device is in an off state (FIG. 1). In a state in which source electrode 6 is grounded and a positive voltage is applied to drain electrode 7, as a positive gate voltage is applied to gate electrode 9, the p-n junction depletion layer directly below gate layer 8 decreases. When the gate voltage exceeds a threshold voltage (Vth), a current between the source and the drain starts flowing, and the nitride semiconductor device enters an on state (not illustrated). That is, it is possible to control the current flowing between the source and the drain by a voltage applied to gate electrode 9.

Hereinafter, advantageous effects of the nitride semiconductor device are described. The semiconductor layered structure of the nitride semiconductor device enables suppression of an increase in a drain leakage current and a source leakage current flowing via buffer layer 2 or the bottom portion of channel layer 3 in isolation region 10 during high-voltage operation and during high-temperature operation. In addition, it is possible to improve the reliability characteristics of the nitride semiconductor device by suppressing a leakage current that flows through the crystal defects within channel layer 3 and that increases as time elapses.

Figure 3:
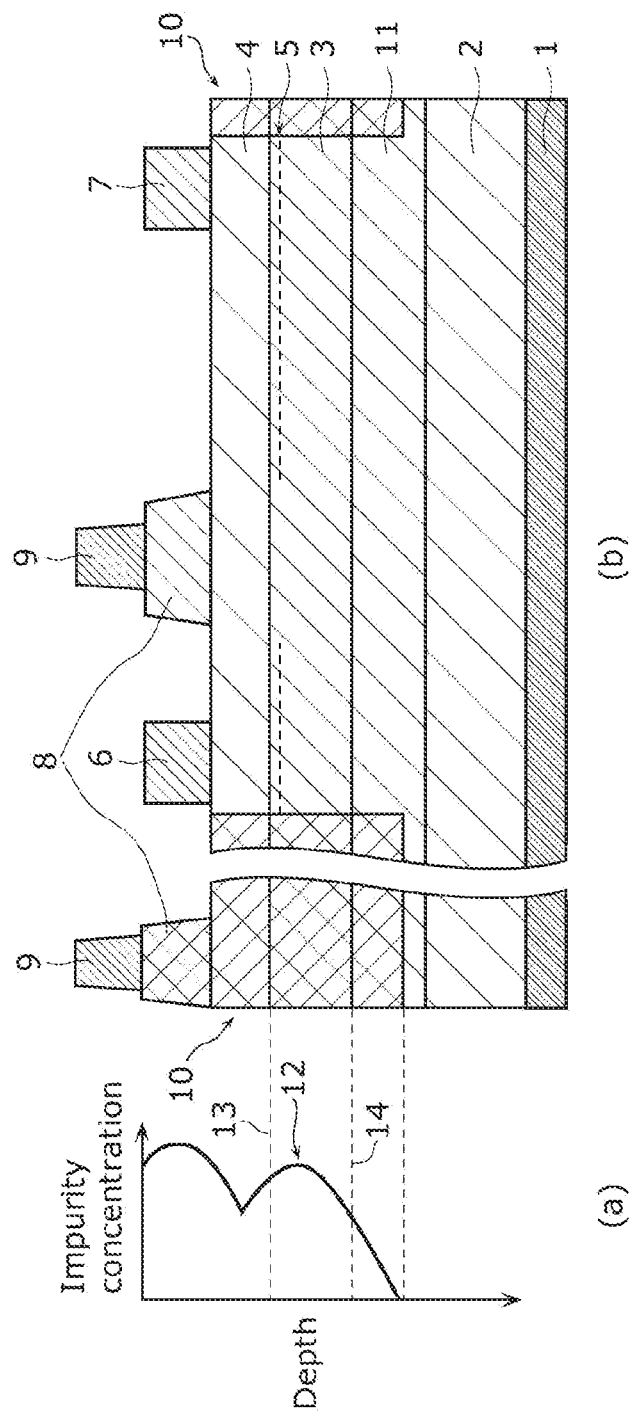
FIG. 3 illustrates a cross-sectional structure of a nitride semiconductor device according to Variations 1 and 2 of the embodiment and a relationship between impurity concentration and depth in an isolation region.

Hereinafter, a nitride semiconductor device according to Variation 1 of the embodiment is described. FIG. 3 illustrates a cross-sectional structure of the nitride semiconductor device according to Variation 1 of the embodiment ((b) in FIG. 3) and a relationship between impurity concentration and depth in an isolation region ((a) in FIG. 3). As illustrated in (b) in FIG. 3, the nitride semiconductor device according to Variation 1 includes a semiconductor layered structure primarily including substrate 1, nitride semiconductor layer (high-carbon layer) 11, channel layer 3, and barrier layer 4. High-carbon layer 11 is formed above substrate 1 and has a high carbon (C) concentration. Channel layer 3 is formed above high-carbon layer 11, has a lower C concentration than high-carbon layer 11, and is made of a nitride semiconductor layer. Barrier layer 4 is formed on channel layer 3, has a wider band gap than channel layer 3, and is made of a nitride semiconductor layer. In the embodiment, more specifically, the semiconductor layered structure includes, in order from bottom to top, substrate 1, buffer layer 2, high-carbon layer 11, channel layer 3, two-dimensionalelectron-gas layer 5, barrier layer 4, and gate layer 8. The semiconductor layered structure includes isolation region 10 in which impurities are implanted. As illustrated in (a) in FIG. 3, isolation region 10 extends from the top surface of the semiconductor layered structure and reaches high-carbon layer 11. The highest impurity concentration within channel layer 3 is lower than or equal to 70 times the impurity concentration at interface 14 between high-carbon layer 11 and channel layer 3. It should be noted that the expression high C concentration is a relative expression and means a C concentration higher than the C concentration in the channel layer.

That is, high-carbon layer 11, which is a group III-nitride semiconductor layer having a high C concentration, is present between buffer layer 2 and channel layer 3. Isolation region 10 extends from the top surface of the semiconductor layered structure and reaches high-carbon layer 11. The highest impurity concentration within channel layer 3 is lower than or equal to 70 times the impurity concentration at interface 14 between high-carbon layer 11 and channel layer 3. It should be noted that although group III-nitride semiconductors are described in Variation 1, semiconductors in the present invention are not limited to the group III-nitride semiconductors. In addition, the semiconductor layered structure described herein represents a minimum structure and is not limited to the minimum structure.

Unlike the semiconductor layered structure in the embodiment illustrated in FIGS. 1 and 2, the semiconductor layered structure in Variation 1 includes high-carbon layer 11 between buffer layer 2 and channel layer 3 (high-carbon layer 11 may be a single layer or layers made of one or more of, for example, GaN, AlGaN, AlN, InGaN, InN, and AlInGaN, which are group III-nitride semiconductors having high-carbon concentrations). Carbon (C) in a group III-nitride semiconductor layer acts as an acceptor level in the crystal, which leads to higher conduction band potential and the high resistance of a group III-nitride semiconductor. Thus, high-carbon layer 11 has high resistance. In addition, the semiconductor layered structure in Variation 1 differs from the semiconductor layered structure in the embodiment illustrated in FIGS. 1 and 2 in the following respects. Isolation region 10 whose high resistance has been achieved by implanting impurities extends from the top surface of the semiconductor layered structure and reaches high-carbon layer 11. The highest impurity concentration within channel layer 3 is lower than or equal to 70 times the impurity concentration at interface 14 between high-carbon layer 11 and channel layer 3.

As described in the embodiment with reference to FIGS. 1 and 2, for the sake of an efficient electron flow, it is preferable that channel layer 3 have fewer extra energy levels and a lower C concentration. Specifically, it is preferable that C concentrations within channel layer 3 be lower than 1E+18 cm$^{-3}$, if possible, lower than or equal to 5E+17 cm$^{-3}$. In contrast, to decrease a leakage current between the drain and the substrate, it is preferable that C concentrations within high-carbon layer 11 be higher than or equal to 1E+18 cm$^{-3}$, if possible, higher than or equal to 1E+19 cm$^{-3}$. This can suppress a leakage current from flowing into buffer layer 2. In addition, a group III-nitride semiconductor having a wider band gap than channel layer 3 may be used as high-carbon layer 11. This enables carriers to be confined in channel layer 3, which improves pinch-off characteristics.

Figure 4:
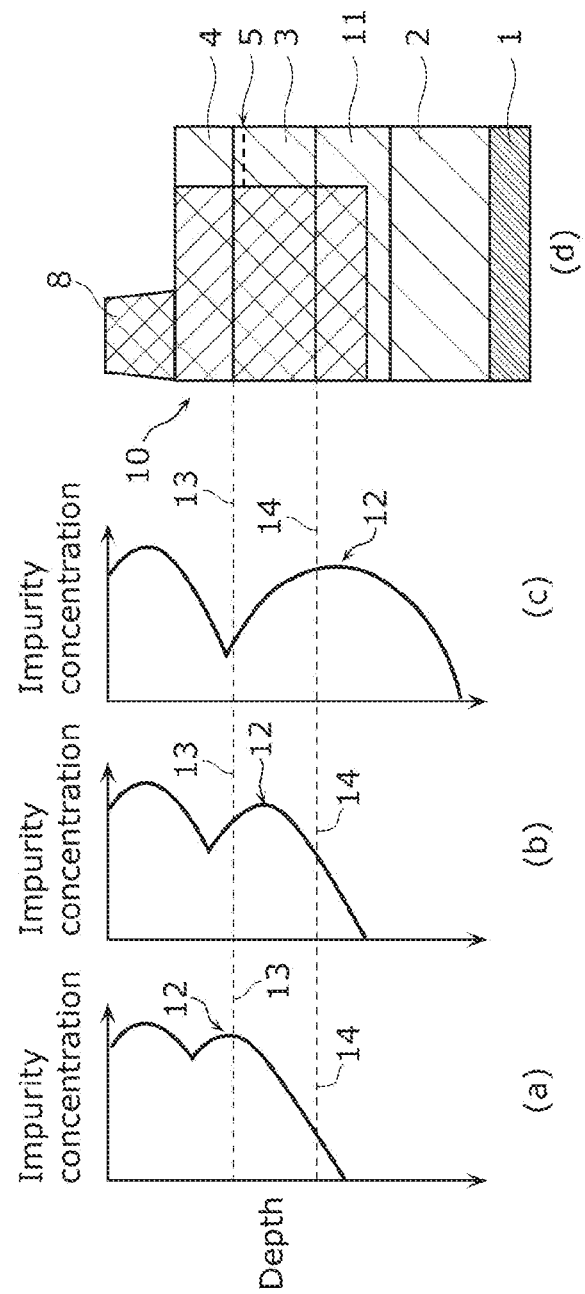
FIG. 4 illustrates detailed relationships between impurity concentration and depth in the isolation region in the nitride semiconductor device according to Variations 1 and 2 of the embodiment.

FIG. 4 illustrates detailed relationships between impurity concentration and depth in the isolation region in the nitride semiconductor device according to Variation 1 of the embodiment. Impurity concentration peak 12 in the depth direction in isolation region 10 may be in channel layer 3 as illustrated in (b) in FIG. 4 or in high-carbon layer 11 below channel layer 3 as illustrated in (c) in FIG. 4. However, it is not preferable that impurity concentration peak 12 in the depth direction be above interface 13 between barrier layer 4 and channel layer 3 as illustrated in (a) in FIG. 4. In a distribution as illustrated in (a) in FIG. 4, the impurity implantation dose in high-carbon layer 11 is excessively low, which increases a drain leakage current and a source leakage current flowing via high-carbon layer 11 and buffer layer 2. It should be noted that the bottom of isolation region 10 does not have to be in high-carbon layer 11 and may reach buffer layer 2 as illustrated in (c) in FIG. 4. In this case, a drain leakage current and a source leakage current can be further decreased.

Figure 5:
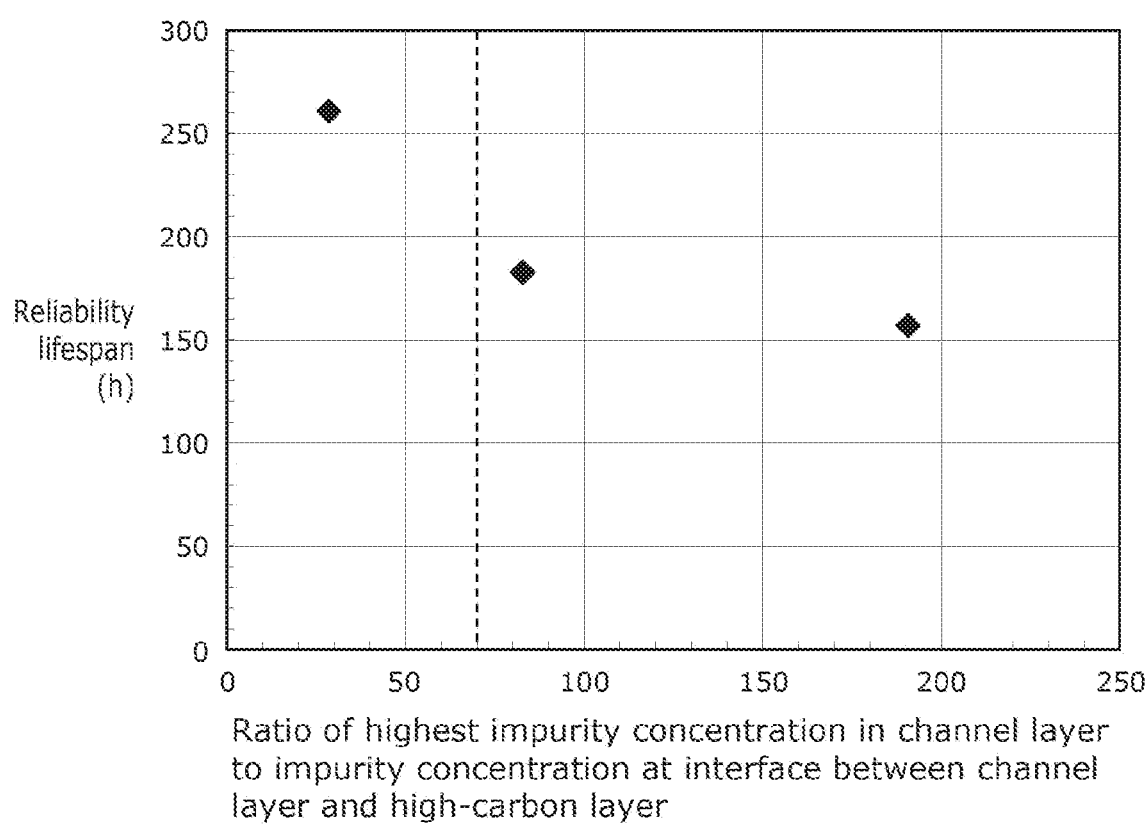
FIG. 5 illustrates the characteristics of the nitride semiconductor device according to Variation 1 of the embodiment.

FIG. 5 illustrates the characteristics of the nitride semiconductor device according to Variation 1 of the embodiment. More specifically, FIG. 5 illustrates a correlation between reliability lifespan and the ratio of the highest impurity concentration within channel layer 3 to the impurity concentration at interface 14 between high-carbon layer 11 and channel layer 3 (the numerator of the ratio is the highest impurity concentration within channel layer 3). The smaller the ratio, the lower the highest impurity concentration within channel layer 3 in comparison with the impurity concentration at interface 14 between high-carbon layer 11 and channel layer 3. The reliability lifespan described herein means lifespan under accelerated test conditions: the nitride semiconductor device in an off state (in a state in which two-dimensional-electron-gas layer 5 directly below gate layer 8 is partially depleted) is operated at a high temperature (e.g., 150 degrees Celsius or higher) and at a high voltage (e.g., a drain voltage of 600 V or higher). According to FIG. 5, the smaller the impurity concentration ratio, the longer the reliability lifespan. When the ratio is lower than or equal to 70 times, the reliability lifespan significantly increases. By suppressing the impurity implantation dose in channel layer 3, crystal defects within channel layer 3 are suppressed, leading to suppression of a leakage current that flows through the crystal defects within channel layer 3 and that increases as time elapses. Accordingly, the nitride semiconductor device have improved reliability characteristics.

By employing the semiconductor layered structure in Variation 1, it is possible to obtain effects equivalent to the effects described in the embodiment. In addition, in the semiconductor layered structure in Variation 1, isolation region 10 extends from the top surface of the semiconductor layered structure and reaches high-carbon layer 11. Thus, the active region that is a region other than isolation region 10 is surrounded by isolation region 10 in a lateral direction. In a vertical direction, high-carbon layer 11 having high resistance is under the active region. That is, the active region is fully surrounded in all directions. Thus, in comparison with the structure described in the embodiment, it is possible to further suppress a drain leakage current and a source leakage current flowing via buffer layer 2 and high-carbon layer 11 or via a bottom portion of channel layer 3 in isolation region 10. In addition, the highest impurity concentration within channel layer 3 is lower than or equal to 70 times the impurity concentration at interface 14 between high-carbon layer 11 and channel layer 3. Thus, it is possible to suppress crystal defects in channel layer 3, leading to suppression of a leakage current that flows through the crystal defects in channel layer 3 within isolation region 10 and that increases as time elapses. In this manner, it is possible to further improve the reliability characteristics of the nitride semiconductor device in comparison with the reliability characteristics described in the embodiment.

Hereinafter, a nitride semiconductor device according to Variation 2 of the embodiment is described. It should be noted that the same figure is used in Variations 1 and 2. FIG. 3 illustrates a cross-sectional structure of the nitride semiconductor device according to Variation 2 of the embodiment ((b) in FIG. 3) and a relationship between impurity concentration and depth in an isolation region ((a) in FIG. 3). In principle, the structure of the nitride semiconductor device according to Variation 2 is the same as that of the nitride semiconductor device according to Variation 1 of the embodiment. However, in Variation 2, as illustrated in (a) in FIG. 3, isolation region 10 of the nitride semiconductor device extends from the top surface of a semiconductor layered structure and reaches high-carbon layer 11, and the highest impurity concentration at interface 13 between barrier layer 4 and channel layer 3 is lower than or equal to 40 times the impurity concentration at interface 14 between high-carbon layer 11 and channel layer 3.

That is, high-carbon layer 11 is present between buffer layer 2 and channel layer 3. Isolation region 10 extends from the top surface of the semiconductor layered structure and reaches high-carbon layer 11. The impurity concentration at interface 13 between barrier layer 4 and channel layer 3 is lower than or equal to 40 times the impurity concentration at interface 14 between high-carbon layer 11 and channel layer 3. Although group III-nitride semiconductors are described in Variation 2, semiconductors in the present invention are not limited to the group III-nitride semiconductors. In addition, the semiconductor layered structure represents a minimum structure and is not limited to the minimum structure.

Unlike the semiconductor layered structure in the embodiment illustrated in FIGS. 1 and 2, the semiconductor layered structure in Variation 2 includes high-carbon layer 11 between buffer layer 2 and channel layer 3 (high-carbon layer 11 may be a single layer or layers made of one or more of, for example, GaN, AlGaN, AlN, InGaN, InN, and AlInGaN, which are group III-nitride semiconductors having high C concentrations). Carbon (C) in a group III-nitride semiconductor layer acts as an acceptor level in the crystal, which leads to higher conduction band potential and the high resistance of a group III-nitride semiconductor. Thus, high-carbon layer 11 has high resistance. The semiconductor layered structure in Variation 2 differs from the semiconductor layered structure in the embodiment illustrated in FIGS. 1 and 2 in the following respects: isolation region 10 whose high resistance has been achieved by implanting impurities extends from the top surface of the semiconductor layered structure and reaches high-carbon layer 11; and the impurity concentration at interface 13 between barrier layer 4 and channel layer 3 is lower than or equal to 40 times the impurity concentration at interface 14 between high-carbon layer 11 and channel layer 3.

As described in the embodiment with reference to FIGS. 1 and 2, for the sake of an efficient electron flow, it is preferable that channel layer 3 have fewer extra energy levels and a lower C concentration. Specifically, it is preferable that C concentrations within channel layer 3 be lower than 1E+18 cm$^{-3}$, if possible, lower than or equal to 5E+17 cm$^{-3}$. In contrast, to decrease a leakage current between a drain and a substrate, it is preferable that C concentrations within high-carbon layer 11 be higher than or equal to 1E+18 cm$^{-3}$, if possible, higher than or equal to 1E+19 cm$^{-3}$. This can suppress a leakage current from flowing into buffer layer 2. In addition, a group III-nitride semiconductor having a wider band gap than channel layer 3 may be used as high-carbon layer 11. This enables carriers to be confined in channel layer 3, which improves pinch-off characteristics.

Impurity concentration peak 12 in the depth direction in isolation region 10 may be in channel layer 3 as illustrated in (b) in FIG. 4 or in high-carbon layer 11 below channel layer 3 as illustrated in (c) in FIG. 4. However, it is not preferable that impurity concentration peak 12 in the depth direction be above interface 13 between barrier layer 4 and channel layer 3 as illustrated in (a) in FIG. 4. In a distribution as illustrated in (a) in FIG. 4, the impurity implantation dose in high-carbon layer 11 is excessively low, which increases a drain leakage current and a source leakage current flowing via high-carbon layer 11 and buffer layer 2. It should be noted that the bottom of isolation region 10 does not have to be in high-carbon layer 11 and may reach buffer layer 2 as illustrated in (c) in FIG. 4. In this case, a drain leakage current and a source leakage current can be further decreased.

Figure 6:
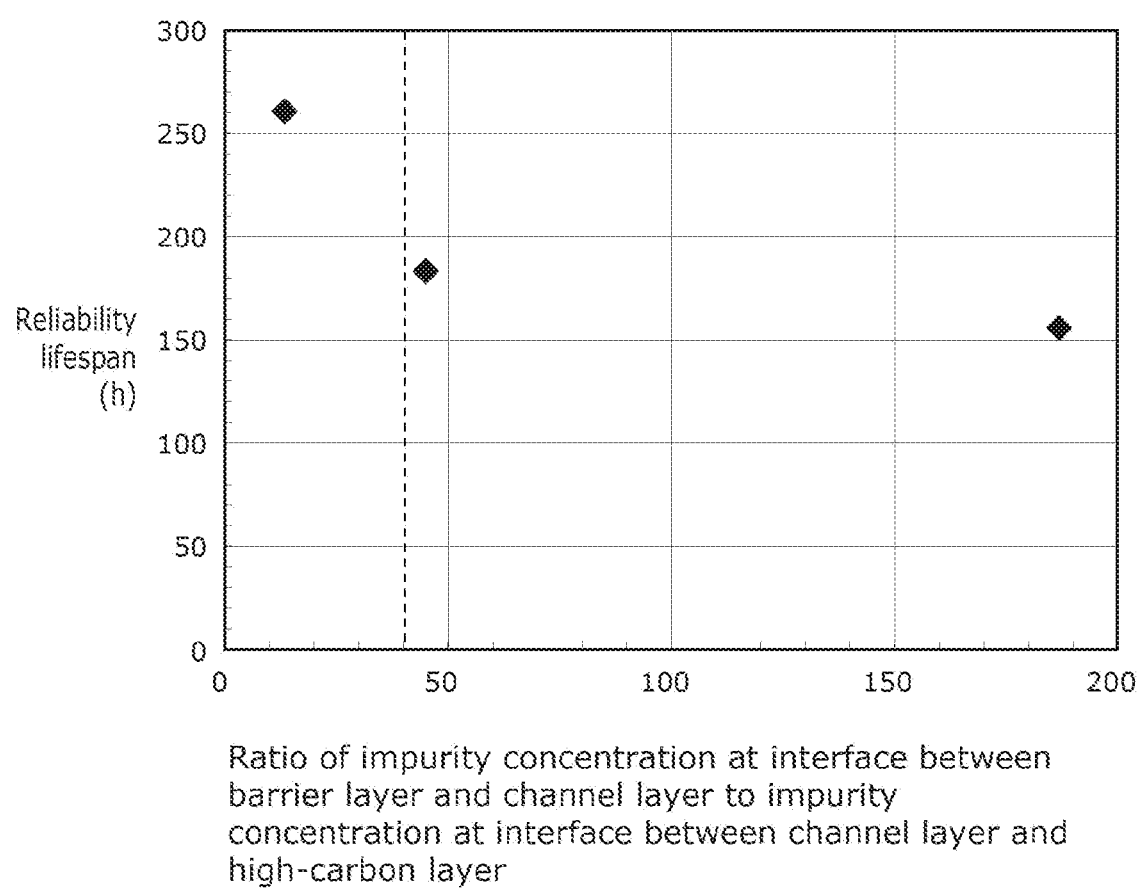
FIG. 6 illustrates the characteristics of the nitride semiconductor device according to Variation 2 of the embodiment.

FIG. 6 illustrates the characteristics of the nitride semiconductor device according to Variation 2 of the embodiment. More specifically, FIG. 6 illustrates a correlation between reliability lifespan and the ratio of the impurity concentration at interface 13 between barrier layer 4 and channel layer 3 to the impurity concentration at interface 14 between high-carbon layer 11 and channel layer 3 (the numerator of the ratio is the impurity concentration at interface 13 between barrier layer 4 and channel layer 3). The smaller the ratio, the lower the impurity concentration at interface 13 between barrier layer 4 and channel layer 3 in comparison with the impurity concentration at interface 14 between high-carbon layer 11 and channel layer 3. It should be noted that the reliability lifespan described herein means lifespan under accelerated test conditions: the nitride semiconductor device in an off state (in a state in which two-dimensional-electron-gas layer 5 directly below gate layer 8 is partially depleted) is operated at a high temperature (e.g., 150 degrees Celsius or higher) and at a high voltage (e.g., a drain voltage of 600 V or higher). According to FIG. 6, the smaller the impurity concentration ratio, the longer the reliability lifespan. When the ratio is lower than or equal to 40 times, the reliability lifespan significantly increases. By suppressing the impurity implantation dose in channel layer 3, especially in a portion of channel layer 3 near barrier layer 4, that is, in two-dimensional-electron-gas layer 5 through which electrons tend to flow, it is possible to suppress crystal defects in the portion of channel layer 3 near barrier layer 4. This enables suppression of a leakage current that flows through crystal defects in channel layer 3 within isolation region 10 and that increases as time elapses. Accordingly, the nitrite semiconductor device have improved reliability characteristics.

By employing the semiconductor layered structure in Variation 2, it is possible to obtain effects equivalent to the effects described in the embodiment. In addition, in the semiconductor layered structure in Variation 2, isolation region 10 extends from the top surface of the semiconductor layered structure and reaches high-carbon layer 11. Thus, the active region that is a region other than isolation region 10 is surrounded by isolation region 10 in a lateral direction. In a vertical direction, high-carbon layer 11 having high resistance is under the active region. That is, the active region is fully surrounded in all directions. Thus, in comparison with the structure described in the embodiment, it is possible to further suppress a drain leakage current and a source leakage current flowing via buffer layer 2 and high-carbon layer 11 or via a bottom portion of channel layer 3 in isolation region 10. In addition, the impurity concentration at interface 13 between barrier layer 4 and channel layer 3 is lower than or equal to 40 times the impurity concentration at interface 14 between high-carbon layer 11 and channel layer 3. Thus, it is possible to suppress crystal defects in the portion of channel layer 3 near barrier layer 4, leading to suppression of a leakage current that flows through the crystal defects within channel layer 3 and that increases as time elapses. In this manner, it is possible to further improve the reliability characteristics of the nitride semiconductor device in comparison with the reliability characteristics described in the embodiment.

Hereinafter, a nitride semiconductor device according to Variation 3 of the embodiment is described. In comparison with the embodiment described with reference to FIGS. 1 to 4, a semiconductor layered structure in Variation 3 includes isolation region 10 in which the highest impurity concentration within channel layer 3 is lower than or equal to $6E+19$ cm$^{-3}$. Although group III-nitride semiconductors are described in Variation 3, semiconductors in the present invention are not limited to the group III-nitride semiconductors. In addition, the semiconductor layered structure represents a minimum structure and is not limited to the minimum structure.

Figure 7:
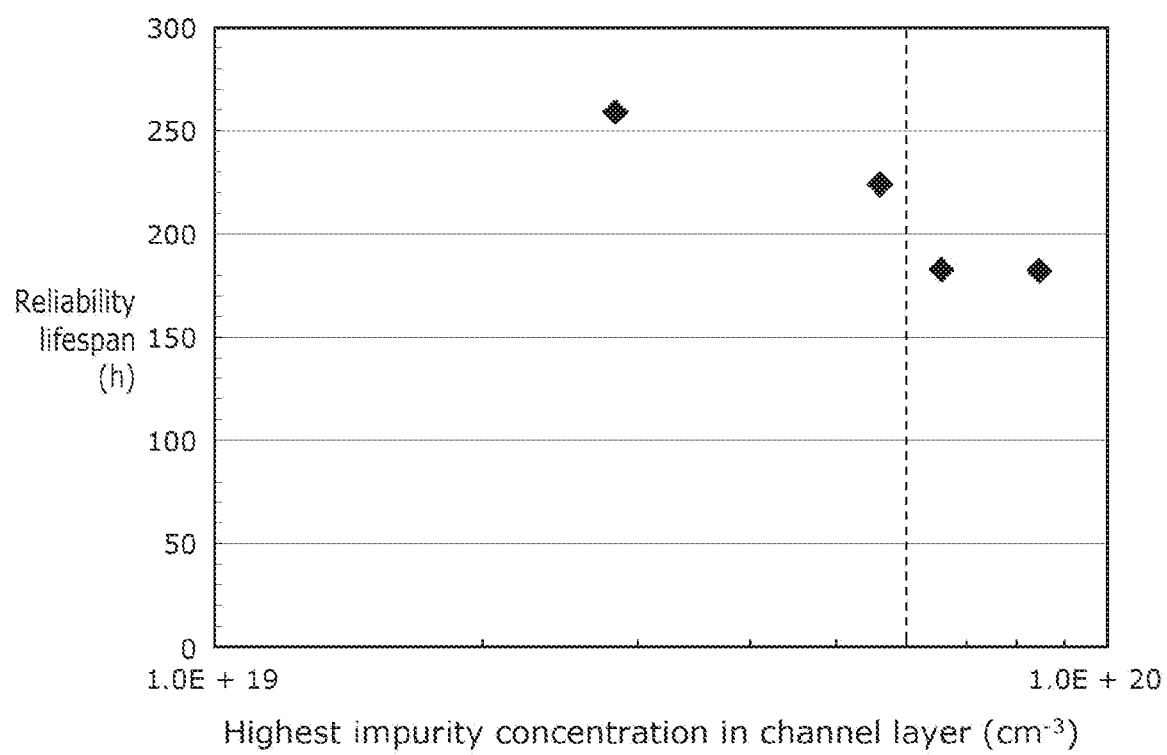
FIG. 7 illustrates the characteristics of a nitride semiconductor device according to Variation 3 of the embodiment.

FIG. 7 illustrates the characteristics of the nitride semiconductor device according to Variation 3 of the embodiment. More specifically, FIG. 7 illustrates a correlation between reliability lifespan and the highest impurity concentration within channel layer 3 in isolation region 10. According to FIG. 7, the smaller the highest impurity concentration within channel layer 3, the longer the reliability lifespan. When the highest impurity concentration is lower than or equal to $6E+19$ cm$^{-3}$, the reliability lifespan significantly increases. By suppressing the impurity implantation dose in channel layer 3, crystal defects in channel layer 3 are suppressed, leading to suppression of a leakage current that flows through the crystal defects within channel layer 3 and that increases as time elapses. Accordingly, the nitrite semiconductor device have improved reliability characteristics. It should be noted that the reliability lifespan described herein means lifespan under accelerated test conditions: the nitride semiconductor device in an off state (in a state in which a part of a portion directly below gate layer 8 has no carriers) is operated at a high temperature (e.g., 150 degrees Celsius or higher) and at a high voltage (e.g., a drain voltage of 600 V or higher).

By employing the semiconductor layered structure in Variation 3, it is possible to obtain effects equivalent to the effects described in the embodiment and Variations 1 and 2. Since the highest impurity concentration within channel layer 3 is lower than or equal to $6E+19$ cm$^{-3}$, crystal defects in channel layer 3 are suppressed, leading to effective suppression of a leakage current that flows through the crystal defects within channel layer 3 and that increases as time elapses. In this manner, it is possible to further improve the reliability characteristics of the nitride semiconductor device in comparison with the nitride semiconductor devices described in the embodiment and Variations 1 and 2.

Hereinafter, a nitride semiconductor device according to Variation 4 of the embodiment is described. In comparison with the embodiment described with reference to FIGS. 1 to 4, a semiconductor layered structure according to Variation 4 includes isolation region 10 in which the impurity concentration at interface 13 between barrier layer 4 and channel layer 3 is lower than or equal to $3E+19$ cm$^{-3}$. Although group III-nitride semiconductors are described in Variation 4, semiconductors in the present invention are not limited to the group III-nitride semiconductors. In addition, the semiconductor layered structure represents a minimum structure and is not limited to the minimum structure.

Figure 8:
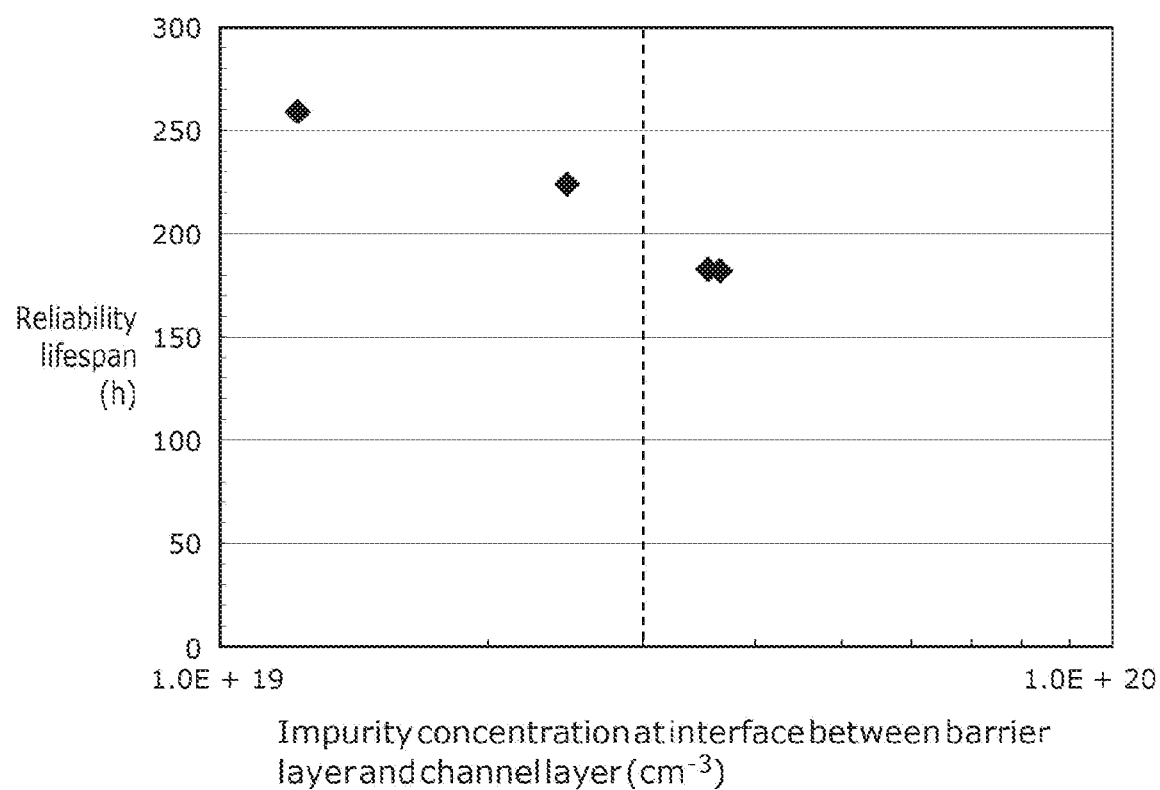
FIG. 8 illustrates the characteristics of a nitride semiconductor device according to Variation 4 of the embodiment.

FIG. 8 illustrates the characteristics of the nitride semiconductor device according to Variation 4 of the embodiment. More specifically, FIG. 8 illustrates a correlation between reliability lifespan and impurity concentration at interface 13 between barrier layer 4 and channel layer 3 in isolation region 10. According to FIG. 8, the smaller the impurity concentration at interface 13 between barrier layer 4 and channel layer 3, the longer the reliability lifespan. When the impurity concentration is lower than or equal to $3E+19$ cm$^{-3}$, the reliability lifespan significantly increases. By suppressing the impurity implantation dose in channel layer 3, especially in a portion of channel layer 3 near barrier layer 4, that is, in two-dimensional-electron-gas layer 5 through which electrons tend to flow and at interface 13 between barrier layer 4 and channel layer 3, crystal defects in the portions are suppressed. This enables suppression of a leakage current that flows through crystal defects within channel layer 3 and that increases as time elapses. Accordingly, the nitrite semiconductor device have improved reliability characteristics. It should be noted that the reliability lifespan described herein means lifespan under accelerated test conditions: the nitride semiconductor device in an off state (in a state in which a part of a portion directly below gate layer 8 has no carriers) is operated at a high temperature (e.g., 150 degrees Celsius or higher) and at a high voltage (e.g., a drain voltage of 600 V or higher).

By employing the semiconductor layered structure in Variation 4, it is possible to obtain effects equivalent to the effects described in the embodiment and Variations 1 and 2. Since the impurity concentration at interface 13 between barrier layer 4 and channel layer 3 is lower than or equal to $3E+19$ cm$^{-3}$, the crystal defects in two-dimensional-electron-gas layer 5 within channel layer 3 are suppressed, leading to effective suppression of a leakage current that flows through the crystal defects within channel layer 3 and that increases as time elapses. In this manner, it is possible to further improve the reliability characteristics of the nitride semiconductor device in comparison with the nitride semiconductor devices described in the embodiment and Variations 1 and 2.

Hereinafter, a nitride semiconductor device according to Variation 5 of the embodiment is described. In comparison with the variations of the embodiment described with reference to FIGS. 3 and 4, in a semiconductor layered structure in Variation 5, the impurity concentration at interface 14 between high-carbon layer 11 and channel layer 3 is higher than or equal to $5E+17$ cm$^{-3}$. Although group III-nitride semiconductors are described in Variation 5, semiconductors in the present invention are not limited to the group III-nitride semiconductors. In addition, the semiconductor layered structure represents a minimum structure and is not limited to the minimum structure.

Figure 9:
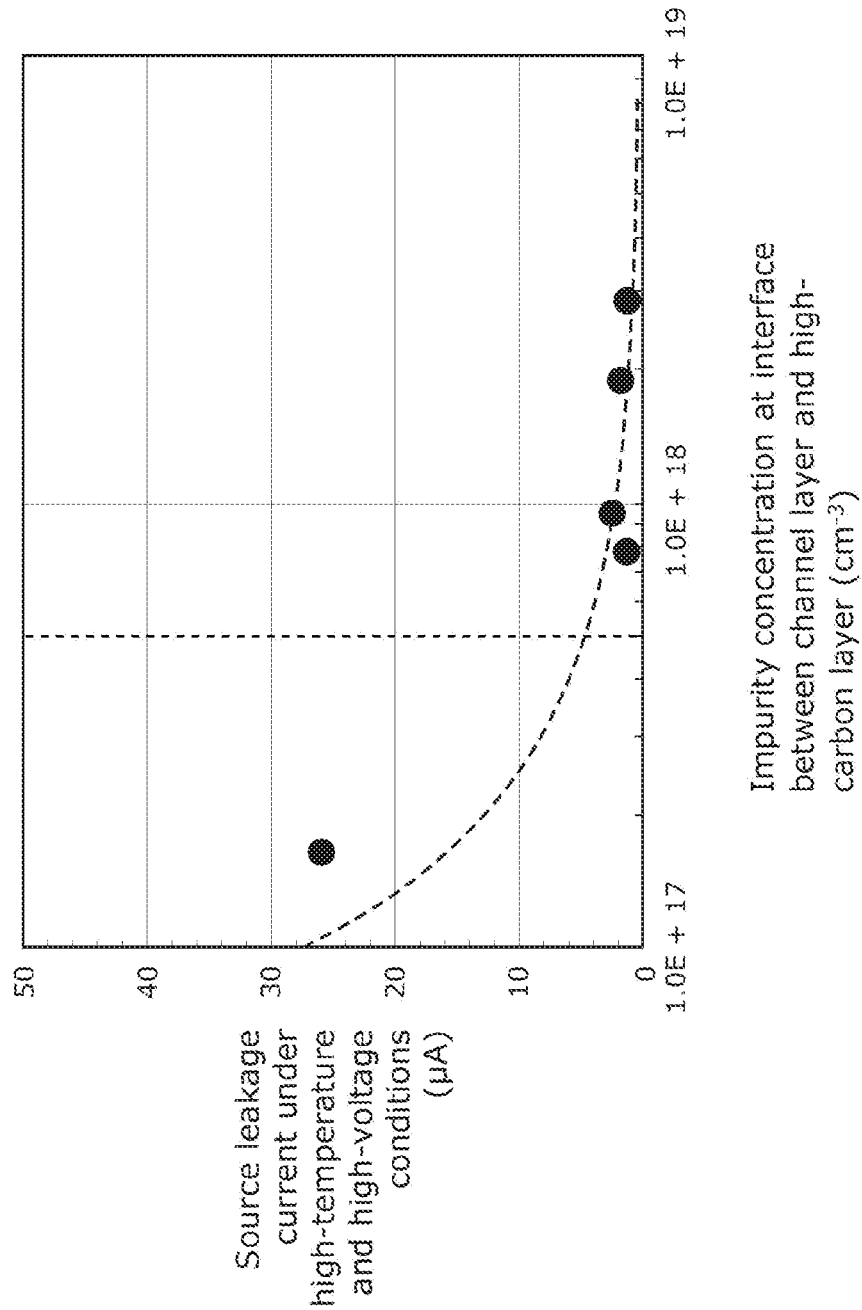
FIG. 9 illustrates the characteristics of a nitride semiconductor device according to Variation 5 of the embodiment.

FIG. 9 illustrates the characteristics of the nitride semiconductor device according to Variation 5 of the embodiment. More specifically, FIG. 9 illustrates a correlation between the impurity concentration at interface 14 between high-carbon layer 11 and channel layer 3 in isolation region 10 and a source leakage current under high-temperature and high-voltage conditions. It should be noted that the high-temperature and high-voltage conditions described herein correspond to, for example, a temperature of 150 degrees Celsius or higher and a drain voltage of 600 V or higher in an off state. According to FIG. 9, the lower the impurity concentration at interface 14 between high-carbon layer 11 and channel layer 3, the source leakage current increases. When the impurity concentration is lower than or equal to $5\text{E}+17\ \text{cm}^{-3}$, the source leakage current significantly increases. Due to the insufficient impurity implantation dose and depth at and around interface 14 between high-carbon layer 11 and channel layer 3 within isolation region 10, sufficient inactivation and sufficiently high resistance are not achieved in a bottom portion of channel layer 3 within isolation region 10. Thus, under the high-temperature and high-voltage conditions, a source leakage current flowing via the bottom portion of channel layer 3 within isolation region 10 is generated. Accordingly, it is preferable that the impurity concentration at interface 14 between high-carbon layer 11 and channel layer 3 be higher than or equal to $5\text{E}+17\ \text{cm}^{-3}$.

By employing the semiconductor layered structure in Variation 5, it is possible to obtain effects equivalent to the effects described in Variations 1 to 4. Since the impurity concentration at interface 14 between high-carbon layer 11 and channel layer 3 is higher than or equal to $5\text{E}+17\ \text{cm}^{-3}$, it is possible to suppress the occurrence of a source leakage current that will flow via the bottom portion of channel layer 3 under the high-temperature and high-voltage conditions. Thus, it is possible to further improve the reliability characteristics of the nitride semiconductor device.

Figure 10:
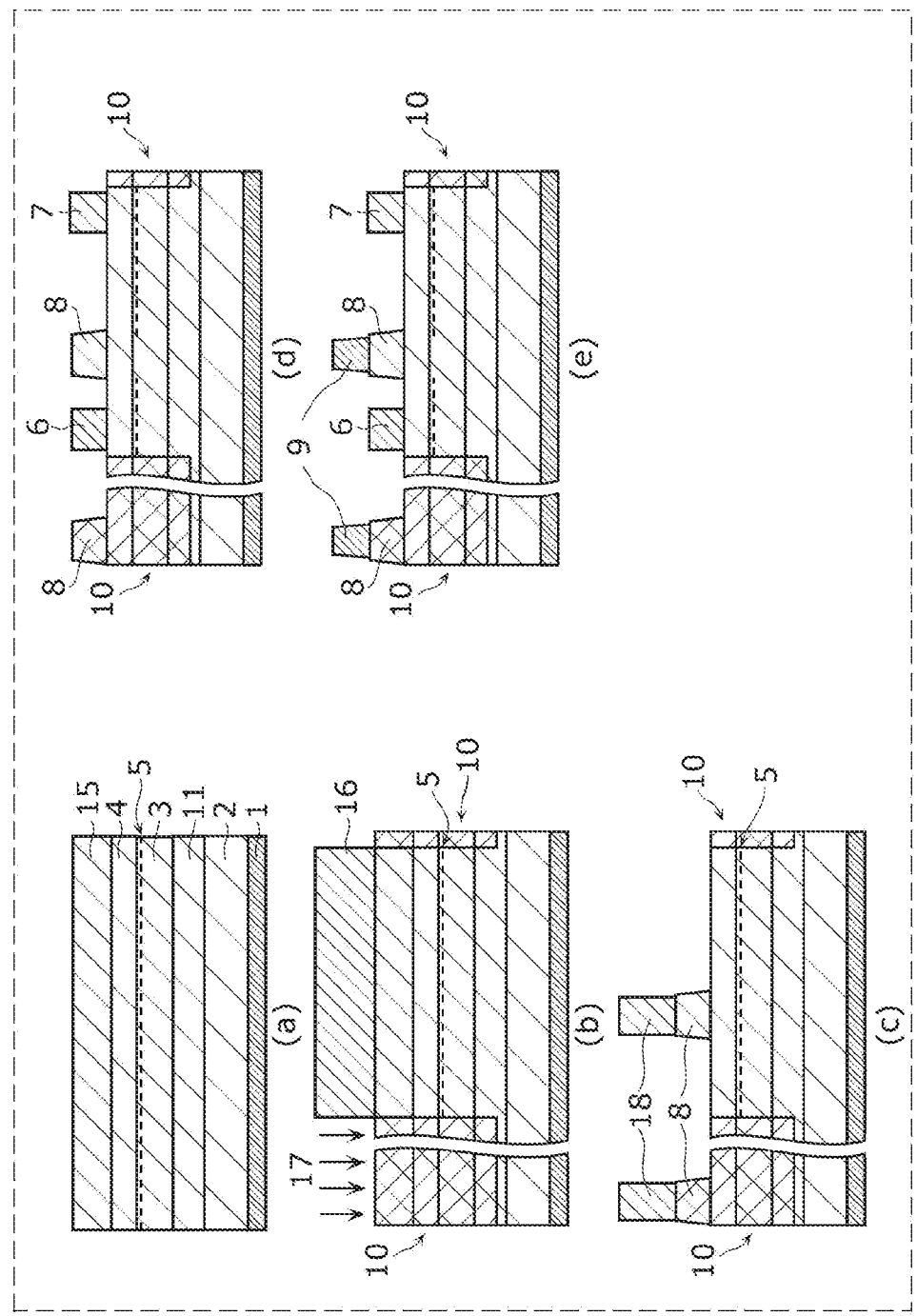
FIG. 10 is a cross-sectional view illustrating the method of fabricating the nitride semiconductor devices according to the embodiment and the variations thereof.

FIG. 10 illustrates cross-sectional views illustrating the method of fabricating the nitride semiconductor devices illustrated in FIGS. 1 to 4. It should be noted that the fabrication method described below includes a minimum number of steps, and a fabrication method in the present invention is not limited to the method including the minimum number of steps. In addition, the order of steps in the fabrication method is not limited to the order described below. It should be noted that unlike the fabrication method illustrated in FIG. 10, high-carbon layer 11 is not epitaxially grown between buffer layer 2 and channel layer 3 in the method of fabricating the nitride semiconductor device illustrated in FIGS. 1 and 2 (not illustrated).

First, suitable Si (111) substrate 1 (alternatively, a substrate made of, for example, Sapphire, SiC, GaN, or AlN) is prepared. Then, suitable buffer layer 2, high-carbon layer 11, channel layer 3, and barrier layer 4 are formed above substrate 1 by the epitaxial growth technique, such as known MOCVD. Buffer layer 2 (a single layer or layers made of one or more of, for example, GaN, AlGaN, AlN, InGaN, InN, and AlInGaN, which are group III-nitride semiconductors) is formed above substrate 1. High-carbon layer 11 (a single layer or layers made of one or more of, for example, GaN, AlGaN, AlN, InGaN, InN, and AlInGaN, which are group III-nitride semiconductors having high C concentrations) is formed above buffer layer 2. Channel layer 3 made of GaN (alternatively, a single layer or layers made of one or more of, for example, InGaN, InN, AlGaN, and AlInGaN, which are group III-nitride semiconductors) is formed above high-carbon layer 11. Barrier layer 4 made of AlGaN (alternatively, for example, GaN, InGaN, AlGaN, AlN, or AlInGaN, which is a group III-nitride semiconductor) is formed above channel layer 3. Cap layer 15 made of p-GaN (alternatively, for example, p-InGaN, p-InN, p-AlGaN, or p-AlInGaN, which is a group III-nitride semiconductor) is formed above barrier layer 4 ((a) in FIG. 10).

It should be noted that cap layer 15 may be made of p-GaN containing Mg, insulating GaN (i-GaN) containing, for example, C (alternatively, for example, i-InGaN, i-InN, i-AlGaN, or i-AlInGaN, which is a group III-nitride semiconductor), or n-GaN containing n-type impurities, such as Si (alternatively, for example, n-InGaN, n-InN, n-AlGaN, or n-AlInGaN, which is a group III-nitride semiconductor). For the sake of an efficient electron flow, it is preferable that channel layer 3 have fewer extra energy levels and a lower C concentration. Specifically, it is preferable that C concentrations within channel layer 3 be lower than $1\text{E}+18\ \text{cm}^{-3}$, if possible, lower than or equal to $5\text{E}+17\ \text{cm}^{-3}$. In contrast, to make high-carbon layer 11 have high resistance and decrease a leakage current between the drain and the substrate, it is preferable that C concentrations within high-carbon layer 11 be higher than or equal to $1\text{E}+18\ \text{cm}^{-3}$, if possible, higher than or equal to $1\text{E}+19\ \text{cm}^{-3}$. Carbon (C) concentrations in the group III-nitride semiconductor layers are adjusted by changing conditions, such as a growth temperature, a growth rate, a growth voltage, and a gas flow rate. If cap layer 15 is a p-type group III-nitride semiconductor, a p-n junction is formed directly below cap layer 15. In a state in which a gate voltage is not applied to gate electrode 9, two-dimensional-electron-gas layer 5 is depleted, which leads to a normally-off state. At that time, the film thickness of barrier layer 4 at that time changes depending on the setting threshold voltage (Vth). However, if barrier layer 4 is AlGaN, under the condition that the Al composition of AlGaN of barrier layer 4 accounts for 20% in a part of a portion directly below gate layer 8, AlGaN has a film thickness of 10 nm to 25 nm, preferably, a film thickness of around 20 nm. In addition, if cap layer 15 is p-GaN, cap layer 15 should have a film thickness of 50 nm to 500 nm, preferably, around 100 nm. If p-type impurities are Mg, a doping concentration should be $1\text{E}+19\ \text{cm}^{-3}$ to $10\text{E}+19\ \text{cm}^{-3}$, preferably, $5\text{E}+19\ \text{cm}^{-3}$. It should be noted that the carrier density of p-GaN doped with Mg at a doping concentration of around $5\text{E}+19\ \text{cm}^{-3}$ ranges from substantially around $1\text{E}+17\ \text{cm}^{-3}$ to $5\text{E}+17\ \text{cm}^{-3}$. This is because the activation rate of Mg is several percent or less, which is extremely low.

Next, resist pattern 16 is formed by known photolithography, and impurities 17 are implanted from above a portion of the top surface of cap layer 15 by known ion implantation, which causes crystal defects and inactivation and forms isolation region 10 having high resistance ((b) in FIG. 10). An element that enables the group III-nitride semiconductor layers to have high resistance are used as impurities 17 to be implanted into isolation region 10. Specifically, it is preferable that at least one of H, He, B, C, N, O, F, Mg, Cl, Ar, Ca, Ti, Cr, Fe, Cu, Zn, As, and Ru be used as the element. To cause implanting impurities 17 to strike a crystal lattice and crystal atoms and accumulate impurities 17 in a crystal, it is preferable that impurities 17 be implanted with a tilt angle little under 10 degrees relative to the c-axis of a group III-nitride semiconductor crystal. In addition, implantation energy and an impurity implantation dose are adjusted so that the impurity implantation depth from the top surface of cap layer 15 reaches high-carbon layer 11 (buffer layer 2 for the method of fabricating the structure illustrated in FIGS. 1 and 2 (not illustrated)). When the depth where the impurity concentration is $1\text{E}+17\ \text{cm}^{-3}$ or higher is defined as the depth of isolation region 10, to form isolation region 10 extending from the top surface of cap layer 15 and reaching high-carbon layer 11, isolation region 10 has a depth of at least 500 nm or greater, preferably, a depth of 800 nm or greater. To achieve the above condition, impurities are implanted at very high implantation energy. An implantation energy of 100 keV or higher, preferably, an implantation energy of 180 keV or higher is used. When impurities 17 are implanted into the group III-nitride semiconductor layers by one-time ion implantation, an impurity concentration distribution in the depth direction is not even and has an impurity concentration peak in the depth direction. The impurity concentration distribution represents an approximate depth direction normal distribution centered around the peak. Thus, to achieve high resistance and inactivation evenly from the top surface of the semiconductor layered structure, such as cap layer 15, to a deep portion, such as high-carbon layer 11, it is preferable that the distribution have at least two impurity concentration peaks in the depth direction. Since each peak is formed by one-time ion plantation, ion implantation is performed more than one time using same resist pattern 16 at different implantation energy and impurity implantation doses. As an example, ion implantation is performed three times under the respective conditions: an implantation energy of 50 keV and an implantation dose of 1E+14 $cm^{-3}$; an implantation energy of 100 keV and an implantation dose of 3E+14 $cm^{-3}$; an implantation energy of 200 keV and an implantation dose of 5E+14 $cm^{-3}$.

Then, although not illustrated, resist pattern 16 is removed by a known technique, such as oxygen ashing or a resist removal technique using an organic solvent. Resist pattern 18 is formed by the known photolithography, and cap layer 15 is selectively removed by the known dry etching to form gate layer 8 (alternatively, a layer made of, for example, p-InGaN, p-AlGaN, p-AlInGaN, i-GaN, i-InGaN, i-AlGaN, i-AlInGaN, n-GaN, n-InGaN, n-AlGaN, or n-AlInGaN, which is a group III-nitride semiconductor) ((c) in FIG. 10).

Then, although not illustrated, resist pattern 18 is removed by a known technique, such as oxygen ashing or a resist removal technique using an organic solvent.

If gate layer 8 contains p-type impurity Mg, in order to activate Mg, activation annealing is performed in nitrogen gas at a temperature of 800 degrees Celsius for around 30 minutes (not illustrated). By performing activation annealing, hydrogen bonds inactivating Mg, which is a p-type element, are cleaved, which improves the activation rate of Mg. Thus, gate layer 8 containing p-type impurities forms a p-n junction depletion layer, and two-dimensional-electron-gas layer 5 directly below gate layer 8 is depleted. In this way, the threshold voltage of gate layer 8, which acts as the gate of a transistor, changes to a positive voltage, leading to normally-off operation.

After that, source electrode 6 and drain electrode 7 are formed by one or more of known techniques, such as photolithography, vapor deposition, a lift-off technique, sputtering, and dry etching, so that source electrode 6 and drain electrode 7 are apart from gate layer 8 ((d) in FIG. 10). Source electrode 6 and drain electrode 7 are each made of one or more of metals, such as Ti, Al, Mo, and Hf capable of making ohmic contact with one of two-dimensional-electron-gas layer 5, barrier layer 4, and channel layer 3. Source electrode 6 and drain electrode 7 should be electrically connected to two-dimensional-electron-gas layer 5. Source electrode 6 and drain electrode 7 may be formed, for example, on the top surface of barrier layer 4 and should be brought into contact with a portion of two-dimensional-electron-gas layer 5, barrier layer 4, and channel layer 3 by a known ohmic recess technique (not illustrated). Annealing may be performed on source electrode 6 and drain electrode 7 to decrease contact resistance.

Finally, gate electrode 9 is formed by one or more of known techniques, such as photolithography, vapor deposition, a lift-off technique, sputtering, and dry etching ((e) in FIG. 10). Gate electrode 9 should be made of one or more of metals, such as Ti, Ni, Pd, Pt, Au, W, WSi, Ta, TiN, Al, Mo, Hf, and Zr. If gate layer 8 is a p-type semiconductor, gate electrode 9 may make ohmic or Schottky contact with gate layer 8. However, ohmic contact enables higher reliability of gate electrode 9. Thus, it is preferable that gate electrode 9 be made of one or more of metals having low contact resistance, such as Ni, Pt, Pd, Au, Ti, Cr, In, Sn, and Al.

FIG. 11 is a plan view illustrating a plan view structure of the nitride semiconductor devices illustrated in FIGS. 1 to 4. FIG. 11 is a plan view in which the structures illustrated in FIGS. 1 to 4 are viewed from above. In the plan view, the structure illustrated in (d) in FIG. 10 in which source electrode 6 and drain electrode 7 are formed is viewed from above. It should be noted that gate layer 8 described herein is made of p-GaN and has an FET structure that performs a normally-off operation. The nitride semiconductor device described herein represents a minimum structure and is not limited to the minimum structure.

Gate layer 8 surrounds source electrode 6. Thus, by forming, directly below gate layer 8, a p-n junction between the source and the drain that enables normally-off operation, a leakage path between the source and the drain is cut off in an off state. In this way, a leakage current between the source and the drain is decreased. Gate layers 8 converge on gate converged portion 19 (converge on the left in FIG. 11). Although not illustrated, gate converged portion 19 is connected to a gate pad in isolation region 10. Although isolation region 10 is outside source electrodes 6, drain electrodes 7, and gate layers 8, gate converged portion 19 and portions of the converging end portions of gate layers 8 (left side in FIG. 11) are part of isolation region 10. As illustrated in FIG. 11, sets of source electrode 6 and drain electrode 7 are formed. In terms of the reliability, it is preferable that the outermost electrodes (the top and bottom electrodes in FIG. 11) be source electrodes 6, since it is possible to relax the electric field distribution between isolation region 10 and source electrode 6 and drain electrode 7.

Although the nitride semiconductor devices and the method of fabricating the same according to the present invention are described above in the embodiment and Variations 1 to 5, the present invention is not limited to the descriptions in the embodiment and Variations 1 to 5. The present invention includes an embodiment obtained by making various changes envisioned by those skilled in the art to the embodiment and Variations 1 to 5 and an embodiment obtained by combining a part of the structural elements in the embodiment and Variations 1 to 5 unless such embodiments depart from the scope of the present invention.

INDUSTRIAL APPLICABILITY

The present invention can be used as a nitride semiconductor device, especially as a nitride semiconductor device whose reliability and power device performance have been improved by decreasing a drain leakage current and a source leakage current under the high-temperature and high-voltage conditions in the semiconductor device.

REFERENCE SIGNS LIST 1 substrate
2 buffer layer
3 channel layer
4 barrier layer
5 two-dimensional-electron-gas layer
6 source electrode
7 drain electrode
8 gate layer
9 gate electrode 10 isolation region
11 high-carbon layer
12 impurity concentration peak in depth direction
13 interface between barrier layer and channel layer
14 interface between high-carbon layer and channel layer
15 cap layer
16, 18 resist pattern
17 impurities
19 gate converged portion

The invention claimed is:

1. A nitride semiconductor device comprising:
a semiconductor layered structure including:
   a substrate;
   a high-carbon-concentration nitride semiconductor layer above the substrate;
   a channel layer disposed above the high-carbon-concentration nitride semiconductor layer, having a carbon concentration lower than a carbon concentration of the high-carbon-concentration nitride semiconductor layer, and including a nitride semiconductor layer; and
   a barrier layer disposed on the channel layer, having a band gap wider than a band gap of the channel layer, and including a nitride semiconductor layer,
wherein the semiconductor layered structure includes an isolation region in which impurities are implanted,
the isolation region extends from a top surface of the semiconductor layered structure and reaches the high-carbon-concentration nitride semiconductor layer,
a distribution of the impurities of the isolation region in a depth direction is not even, and
a highest concentration of the impurities within the channel layer is lower than or equal to 70 times a concentration of the impurities at an interface between the high-carbon-concentration nitride semiconductor layer and the channel layer.

2. The nitride semiconductor device according to claim 1, wherein the highest concentration of the impurities within the channel layer is lower than or equal to $6E+19$ cm$^{-3}$.

3. The nitride semiconductor device according to claim 1, wherein a concentration of the impurities at an interface between the barrier layer and the channel layer is lower than or equal to $3E+19$ cm$^{-3}$.

4. The nitride semiconductor device according to claim 1, wherein the semiconductor layered structure further includes a gate layer disposed on a portion of a top surface of the barrier layer and including a p-type nitride semiconductor, and
the gate layer contains the impurities.

5. The nitride semiconductor device according to claim 4, wherein a depth in which the impurities directly below the gate layer are present is identical to a depth in which the impurities in a portion not directly below the gate layer are present.

6. The nitride semiconductor device according to claim 1, wherein the concentration of the impurities at the interface between the high-carbon-concentration nitride semiconductor layer and the channel layer is higher than or equal to $5E+17$ cm$^{-3}$.

7. The nitride semiconductor device according to claim 1, wherein the carbon concentration in the high-carbon-concentration nitride semiconductor layer is higher than or equal to $1E+18$ cm$^{-3}$, and
the carbon concentration in the channel layer is lower than $1E+18$ cm$^{-3}$.

8. A method of fabricating a nitride semiconductor device, the method comprising:
forming a semiconductor layered structure by preparing a substrate, forming a high-carbon-concentration nitride semiconductor layer above the substrate, forming, above the high-carbon-concentration nitride semiconductor layer, a channel layer including a nitride semiconductor layer, and forming, above the channel layer, a barrier layer having a band gap wider than a band gap of the channel layer and including a nitride semiconductor layer; and
forming an isolation region by implanting impurities from above the semiconductor layered structure,
wherein the forming of the isolation region includes:
implanting the impurities to form the isolation region extending from a top surface of the semiconductor layered structure and reaching the high-carbon-concentration nitride semiconductor layer;
implanting the impurities to cause a distribution of the impurities of the isolation region in a depth direction is not even; and
implanting the impurities to cause a highest concentration of the impurities within the channel layer to be lower than or equal to 70 times a concentration of the impurities at an interface between the high-carbon-concentration nitride semiconductor layer and the channel layer.

9. The nitride semiconductor device according to claim 1, wherein when viewed from the top surface of the semiconductor layered structure along a stacking direction of the barrier layer, the channel layer, the high-carbon-concentration nitride semiconductor layer and the substrate, the isolation region surrounds the semiconductor layered structure.

10. The method according to claim 8, wherein when viewed from the top surface of the semiconductor layered structure along a stacking direction of the barrier layer, the channel layer, the high-carbon-concentration nitride semiconductor layer and the substrate, the isolation region surrounds the semiconductor layered structure.

11. The nitride semiconductor device according to claim 1, wherein the distribution of the impurities of the isolation region in the depth direction has a peak.

12. The method according to claim 8, comprising implanting the impurities to cause the distribution of the impurities of the isolation region in the depth direction has a peak.

* * * * *